United States Patent
Nishizawa

(10) Patent No.: US 7,122,787 B2
(45) Date of Patent: Oct. 17, 2006

(54) IMAGING APPARATUS WITH THREE DIMENSIONAL CIRCUIT BOARD

(75) Inventor: Hiroshi Nishizawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 10/829,576

(22) Filed: Apr. 22, 2004

(65) Prior Publication Data
US 2004/0222352 A1 Nov. 11, 2004

(30) Foreign Application Priority Data
May 9, 2003 (JP) ............................. 2003-132140

(51) Int. Cl.
*H01L 27/14* (2006.01)
*H01L 31/0203* (2006.01)
(52) U.S. Cl. .................. 250/239; 257/433; 257/435; 348/373; 348/374
(58) Field of Classification Search ................ 250/239, 250/208.1; 257/431–435; 348/373, 374
See application file for complete search history.

(56) References Cited

U.S. PATENT DOCUMENTS

| | | | |
|---|---|---|---|
| 5,672,902 A * | 9/1997 | Hatanaka et al. ............ 257/431 |
| 5,742,484 A * | 4/1998 | Gillette et al. .............. 361/789 |
| 6,268,231 B1 | 7/2001 | Wetzel ......................... 438/48 |
| 6,476,417 B1 * | 11/2002 | Honda et al. .................. 257/59 |
| 6,654,064 B1 * | 11/2003 | Ishikawa ..................... 348/374 |
| 2001/0010562 A1* | 8/2001 | Nakagishi et al. ........... 348/374 |
| 2001/0055073 A1* | 12/2001 | Shinomiya ................... 348/374 |
| 2002/0044213 A1 | 4/2002 | Shinomiya et al. .......... 348/340 |

FOREIGN PATENT DOCUMENTS

| | | |
|---|---|---|
| EP | 1 289 281 | 3/2003 |
| JP | 11-14878 | 1/1999 |
| JP | 11-17996 | 1/1999 |
| JP | 2000-341566 | 12/2000 |
| JP | 2001-245186 | 9/2001 |
| JP | 2001-309245 | 11/2001 |

* cited by examiner

*Primary Examiner*—Thanh X. Luu
*Assistant Examiner*—Stephen Yam
(74) *Attorney, Agent, or Firm*—Hamre, Schumann, Mueller & Larson, P.C.

(57) ABSTRACT

Light that has entered a lens held by a barrel portion of a three-dimensional circuit board transmitting virtually no visible light enters a semiconductor imaging device held inside the three-dimensional circuit board. On the side opposite to the barrel portion, the three-dimensional circuit board is provided with a flexible printed circuit for sending a signal to and receiving a signal from the semiconductor imaging device. The region of the flexible printed circuit facing the semiconductor imaging device has sufficient shielding characteristics in a range sensitive to light reception by the semiconductor imaging device. This makes it possible to provide a sufficient shield against a light beam entering from the back surface of the semiconductor imaging device, so that the image quality does not deteriorate even when a conventional shielding sheet is not used. Since the shielding sheet becomes unnecessary, it is possible to reduce the cost of the shielding sheet itself and the number of steps of bonding the shielding sheet. Furthermore, the thickness corresponding to the shielding sheet and the adhesive can be reduced.

6 Claims, 3 Drawing Sheets

IMAGING APPARATUS WITH THREE DIMENSIONAL CIRCUIT BOARD

BACKGROUND OF THE INVENTION

1. Field of the Invention

The present invention relates to a miniaturized imaging apparatus that includes a semiconductor imaging device and is used mainly in a camera or the like for portable equipment.

2. Description of Related Art

In a conventional small-size imaging apparatus, as described in JP 2001-245186 A, imaging light that has passed through a lens is allowed to enter a semiconductor imaging device such as a CCD and converted into an electric signal, thus obtaining an imaging signal. With the demand for smaller size and higher performance of portable equipment, there is an increasing need for reducing the size and weight of the imaging apparatus itself For this purpose, attempts have been made to reduce the thickness of individual components in the imaging apparatus as much as possible, thus achieving a thinner imaging apparatus.

In the case of reducing the thickness of the semiconductor imaging device itself so as to achieve a thinner imaging apparatus, a back surface of a semiconductor wafer generally has been ground to reduce the thickness.

However, in the case of reducing the thickness in this manner, there have been the following problems. Owing to an influence of light entering the semiconductor imaging device from a surface opposite to a light-receiving surface through which imaging light should enter (in the following, referred to as a "back surface"), the imaging light is deteriorated or OB (optical black), which is an optical standard of black reference, varies, so that an excellent imaging signal cannot be obtained. Thus, there has been a limitation of the thickness reduction of the semiconductor imaging device, which poses an obstacle to the thickness reduction of the imaging apparatus.

Furthermore, when the thickness of the semiconductor imaging device is reduced, a resin shielding sheet or the like sometimes has been bonded to the back surface of the semiconductor imaging device for the purpose of preventing the imaging light from deteriorating due to the incident light from the back surface as described above. This increases the number of new working steps and components, raising costs of the imaging apparatus.

SUMMARY OF THE INVENTION

It is an object of the present invention to solve the conventional problems described above and to provide an imaging apparatus that achieves the reduction in thickness while suppressing an increase in the number of new working steps and a cost increase.

In order to achieve the above-mentioned object, an imaging apparatus according to the present invention includes a three-dimensional circuit board transmitting virtually no visible light and including a cylindrical barrel portion and a bottom portion, a semiconductor imaging device held by the three-dimensional circuit board, an optical system that is held by the barrel portion and directs light to the semiconductor imaging device, and a flexible printed circuit, disposed on the three-dimensional circuit board on a side opposite to the barrel portion, for sending a signal to and receiving a signal from the semiconductor imaging device. A region of the flexible printed circuit facing the semiconductor imaging device has sufficient shielding characteristics in a range sensitive to light reception by the semiconductor imaging device.

DESCRIPTION OF THE PREFERRED EMBODIMENTS

Figure 1:
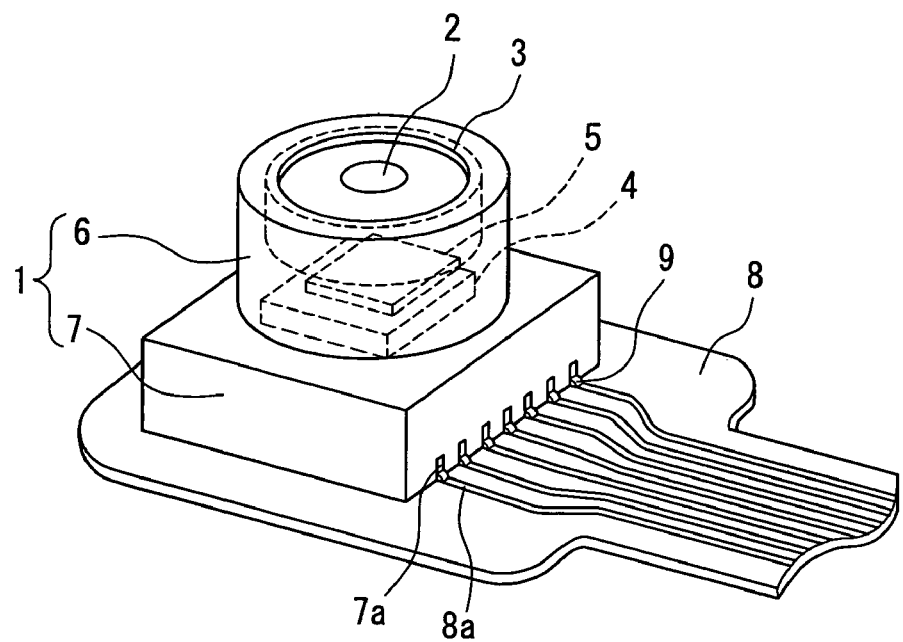
FIG. 1 is a perspective view showing an imaging apparatus according to an embodiment of the present invention.

In the present invention, a "range sensitive to light reception by a semiconductor imaging device" refers to a wavelength range of unwanted light that enters the semiconductor imaging device so as to deteriorate imaging light and vary OB (optical black), thus inhibiting an excellent imaging signal.

The imaging apparatus of the present invention makes it possible to block light entering from the back surface of the semiconductor imaging device sufficiently, so that the image quality does not deteriorate even when a conventional shielding sheet is not used. Since the shielding sheet becomes unnecessary, it is possible to reduce the cost of the shielding sheet itself and the number of steps of bonding the shielding sheet. Furthermore, the thickness corresponding to the shielding sheet and the adhesive can be reduced.

In the above-described imaging apparatus of the present invention, it is preferable that the semiconductor imaging device has a small thickness obtained by grinding its back surface. This makes it easier to reduce the thickness of the semiconductor imaging device, allowing a thinner imaging apparatus. Also, since the light beam entering from the back surface of the semiconductor imaging device can be blocked sufficiently in the imaging apparatus of the present invention as described above, there arises no problem caused by the unwanted light entering the back surface of the semiconductor imaging device even when its thickness is reduced.

Furthermore, in the above-described imaging apparatus of the present invention, it is preferable that in the region of the flexible printed circuit facing the semiconductor imaging device, the shielding characteristics against light with a wavelength longer than a visible range is higher than that against light in the visible range. Out of light entering from the back surface of the semiconductor imaging device, the light with a wavelength longer than the visible range enters more deeply into the semiconductor imaging device. Thus, the flexible printed board has excellent shielding characteristics against light with such a long wavelength, and the influence of light entering from the back surface can be reduced even when the thickness of the semiconductor imaging device is reduced. Consequently, it becomes possible to achieve a thinner imaging apparatus.

Moreover, in the above-described imaging apparatus of the present invention, it is preferable that a metal foil is laminated on the region of the flexible printed circuit facing the semiconductor imaging device. In this manner, the shielding characteristics equivalent to a conventionally-used resin shielding sheet can be achieved with a thinner metal foil, so that the thickness of the imaging apparatus can be reduced. Further, it is appropriate that the metal foil is laminated in at least the region facing the semiconductor imaging device. Accordingly, it is possible to suppress a cost increase caused by laminating the metal foil.

In this case, it is preferable that the metal foil contains aluminum as a main component. This makes it possible to reduce the density of the metal foil, thus reducing the mass of the metal foil. As a result, the lamination of the metal foil causes little increase in mass for the entire imaging apparatus.

Alternatively, the metal foil may contain silver or nickel as a main component. In this way, even when the imaging apparatus is mounted near other circuits as in the case of portable equipment, its excellent high-frequency characteristics help improve EMI characteristics and immunity characteristics of the imaging apparatus.

In the present invention, the "main component" means that the above component accounts for at least 50% by weight and more preferably at least 70% by weight.

Hereinafter, an embodiment of the present invention will be described by way of a specific example.

Figure 2:
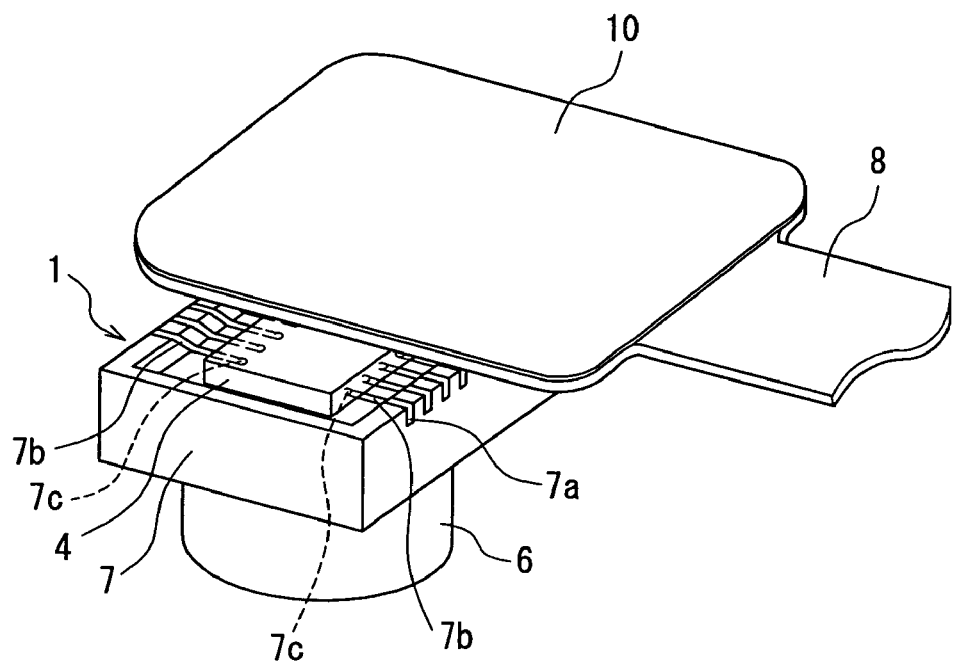
FIG. 2 is an exploded perspective view showing the imaging apparatus according to the embodiment of the present invention, seen from a back surface side.
Figure 3:
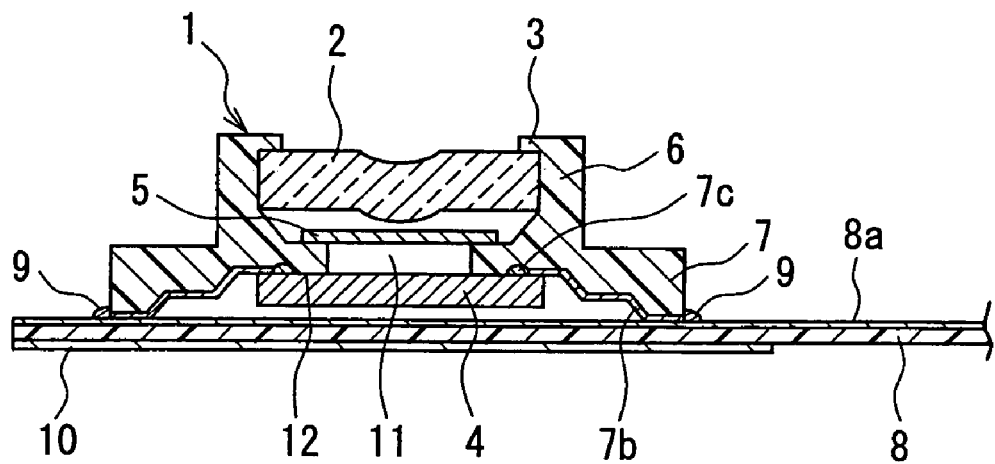
FIG. 3 is a sectional view showing the imaging apparatus according to the embodiment of the present invention.
Figure 4:
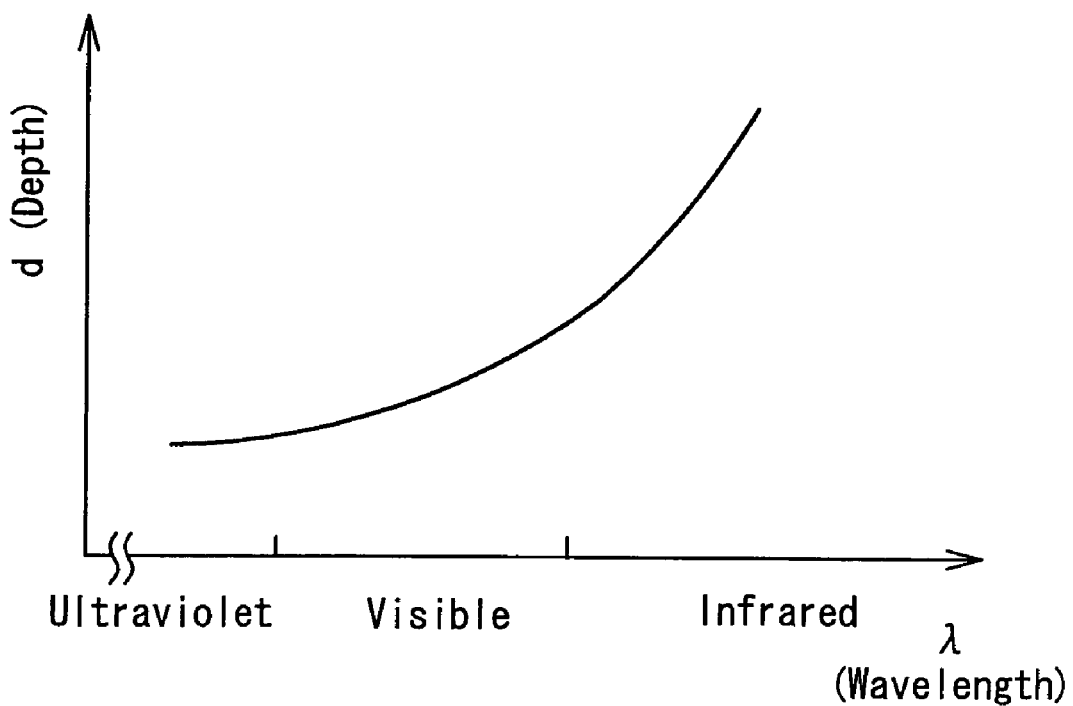
FIG. 4 is a graph showing the relationship between a wavelength and a transmitted distance of light entering from a back surface of a semiconductor imaging device.
Figure 5:
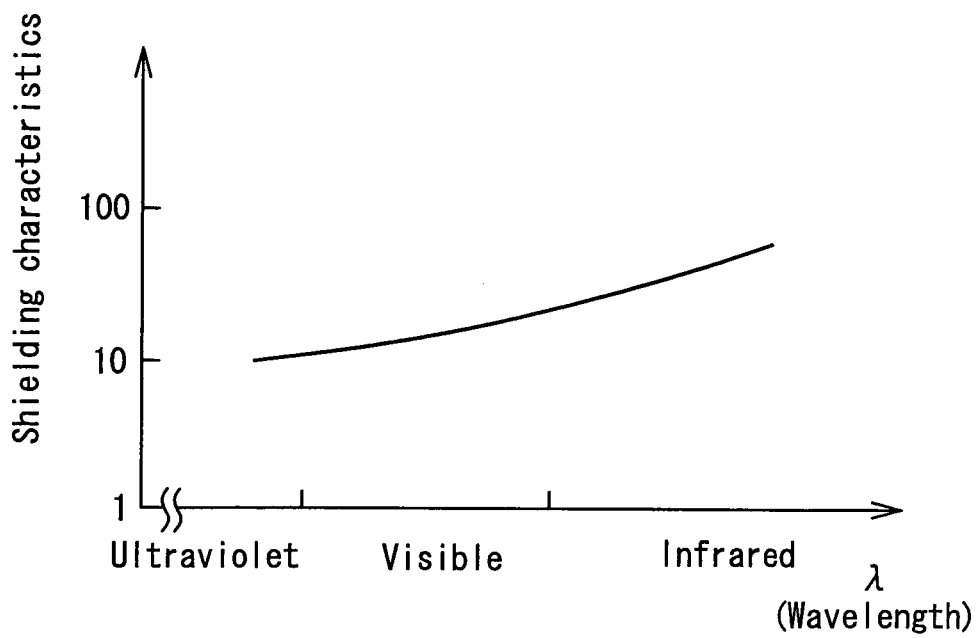
FIG. 5 is a graph showing the relationship between a wavelength of light and shielding characteristics when the light is made to enter from the back surface side of the imaging apparatus of the present invention.
Figure 6:
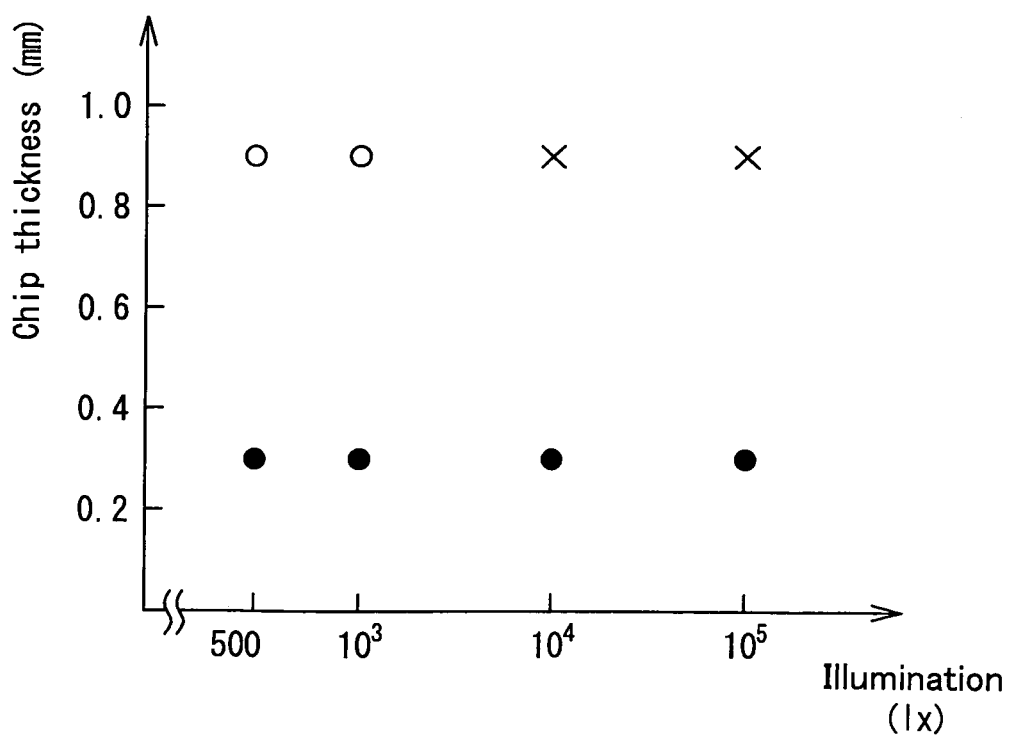
FIG. 6 is a graph showing the relationship between ambient illumination and image quality deterioration.

FIG. 1 is a perspective view showing an embodiment of an imaging apparatus according to the present invention, FIG. 2 is an exploded perspective view showing the imaging apparatus shown in FIG. 1 that is seen from a back surface side, and FIG. 3 is a sectional view showing the imaging apparatus shown in FIG. 1. FIG. 4 is a graph showing the relationship between a wavelength and a transmitted distance of light entering from a back surface of a semiconductor imaging device, FIG. 5 is a graph showing the relationship between a wavelength of light and shielding characteristics when the light is made to enter from the back surface side of the imaging apparatus of the present invention, and FIG. 6 is a graph showing the relationship between ambient illumination and image quality deterioration. Referring to these figures, the imaging apparatus of the present invention will be described in the following.

First, the configuration of the imaging apparatus of the present invention will be described. As shown in FIGS. 1 to 3, a three-dimensional circuit board 1 includes a cylindrical barrel portion 6 and a substantially rectangular parallelepiped bottom portion 7 that are formed as one piece. Near the border of the barrel portion 6 and the bottom portion 7, an opening 11 is formed. The lower rim of the opening 11 is provided with a mounting surface 12 on which a semiconductor imaging device 4 is mounted. The three-dimensional circuit board 1 can be formed of a glass reinforced PPA (a polyphthalamide resin) or the like whose color is black for preventing external visible light from passing through. It is preferable that the three-dimensional circuit board 1 has a transmittance of 1% or lower with respect to a light beam in the visible light range with wavelengths from 380 nm to 780 nm. In the example, a three-dimensional circuit board having a transmittance of 0.2% with respect to a light beam in the visible light range was used. On the surface of the bottom portion 7 opposite to the barrel portion 6, a wiring pattern 7b is formed by electroless plating or the like. One end of the wiring pattern 7b is connected to a connection land 7c formed on the mounting surface 12, while the other end thereof is connected to a terminal 7a provided on an outer lateral surface of the bottom portion 7 of the three-dimensional circuit board 1. The semiconductor imaging device 4 is bare-mounted on the connection land 7c such that its light-receiving surface faces the side of the barrel portion 6. Furthermore, a chip component (not shown) is mounted on the surface of the bottom portion 7 on which the wiring pattern 7b is formed.

An aspherical lens (in the following, simply referred to as a "lens") 2 is fitted in the inner periphery of the barrel portion 6 of the three-dimensional circuit board 1. An optical axis of the lens 2 substantially matches a center axis of the barrel portion 6. An optical filter 5 is disposed between the lens 2 and the opening 11. Above the lens 2, as a part of the barrel portion 6, a diaphragm 3 with a predetermined opening is formed for holding and fixing the lens 2.

The lens 2 may be formed of a resin material satisfying necessary optical characteristics such as transmittance and refractive index. In the example, "ZEONEX" (trade name) manufactured by ZEON Corporation was used. Also, in the example, the lens 2 was constituted by two lenses (in the figure, shown as a single lens for simplicity), and a so-called pan-focus was achieved in which an image of a subject located at a certain distance or farther can be formed. More specifically, the lens was designed such that an excellent focus was obtained for a subject located at a distance of about 30 cm or farther. However, the material, structure and characteristics of the lens 2 are not limited to this example but can be changed suitably according to the intended application.

The optical filter 5 is provided for cutting off unwanted infrared rays and transmitting light with a wavelength in the visible range. For example, a crystal filter or a glass coated with an IR coat can be used. It may be possible to add an AR coat for antireflection as necessary.

The imaging light from the subject enters the diaphragm 3 and is focused by the lens 2. After its infrared component is cut off by the optical filter 5, the imaging light passes through the opening 11 and enters the semiconductor imaging device 4.

The semiconductor imaging device 4 converts incident imaging light into a desired electric signal. In the example, a ⅙-inch VGA CCD with about 320,000 pixels outputting imaging signals in a frame rate of 30 frames per second with an aspect ratio of the screen of 4:3 was used. The semiconductor imaging device 4 was electrically connected to the connection land 7c formed on the mounting surface 12 by a connection method such as BGA (ball grid array) or SBB (stud bump bond).

On the lower side of the three-dimensional circuit board 1, a flexible printed circuit (in the following, referred to as an FPC) 8 is provided so as to cover the lower surface of the three-dimensional circuit board 1. The terminal portion 7a of the three-dimensional circuit board 1 and a land 8a formed on the FPC are electrically connected by solder 9. This also joins the three-dimensional circuit board 1 and the FPC 8 mechanically. In the example, the FPC 8 was prepared by laminating a wiring layer formed of a ⅓ Oz (12 μm) thick rolled copper formed into a predetermined pattern and a cover film having an opening at a predetermined position on a ½ mil (12.5 μm) thick polyimide base film in this order. In the FPC 8, a region including at least a region facing the semiconductor imaging device 4 (a projected region of the semiconductor imaging device 4) has shielding characteristics sufficient to avoid deterioration of the imaging signal by the light entering from the back surface side of the semiconductor imaging device 4. More specifically, it is preferable that the region of the FPC 8 facing the semiconductor imaging device 4 has a transmittance of 0.5% or lower with respect to a light beam in the range sensitive to light reception by the semiconductor imaging device 4. Although the range sensitive to light reception by the semiconductor imaging device 4 varies depending on the semiconductor imaging device 4, a light beam in the range sensitive to light reception by a semiconductor imaging device using a silicon substrate generally has a wavelength of 1200 nm or shorter. The FPC 8 used in the example had a transmittance in the region facing the semiconductor imaging device 4 of 0.2% or lower with respect to a light beam in the visible light range with wavelengths from 380 nm to 780 nm and 0.1% or lower with respect to a light beam with wavelengths from 780 nm to 1200 nm. In the example, in the region including at least the region facing the semiconductor imaging device 4, a 10 µm thick metal foil 10 formed of aluminum having shielding characteristics was fixed by bonding onto the surface opposite to the FPC 8 surface joined to the three-dimensional circuit board 1. As shown in FIG. 2, the metal foil 10 may be larger than the surface facing the FPC 8 on the bottom portion 7 of the three-dimensional circuit board 1 and have a matched outer shape with the FPC 8. In this way, simply by punching out the FPC 8 whose entire surface is laminated in advance with the metal foil 10 into a predetermined shape by press working, the metal foil 10 also can be processed into the predetermined shape. Thus, an inexpensive manufacturing can be achieved without adding any new steps.

The FPC 8 may be provided with a DSP (digital signal processor), which is not shown in the figure, for signal processing, thereby converting the electric signal from the semiconductor imaging device 4 into a signal of a desired form or performing a processing such as white balance adjustment or a color correction.

In general, the thickness of the imaging apparatus is the sum of the thickness of individual components. In order to achieve a thinner apparatus, it is effective to shorten the focal length of the lens 2 by increasing its refractive index and to reduce the thickness of the optical filter 5 in the optical system. As the method for mounting the semiconductor imaging device 4, a bare-mounting using no package is effective for reducing the thickness. It is preferable that known minute lenses corresponding to respective pixels, which are called micro lenses or on-chip lenses, are arranged on the surface of the light-receiving surface of the semiconductor imaging device 4. On the lower side of the micro lenses, a color filter, an aluminum wiring and a photodiode are disposed. They have a thickness of at most about several tens of micrometers.

In the example, the semiconductor imaging device 4 whose thickness was about 0.9 mm when it was a wafer was ground from the back surface side so as to achieve a thickness of 0.3 mm. As becomes clear from FIG. 3, the imaging apparatus can be made thinner by the thickness reduced in the semiconductor imaging device 4. Thus, it would be readily understood that the thickness reduction of the wafer is very effective for achieving a thinner imaging apparatus. The thickness of the wafer is not limited to that illustrated in the above-described example but desirably is determined suitably considering a mounting installation, parameters of the flatness and mechanical strength of the wafer.

In the semiconductor imaging device 4, light that has entered the surface opposite to the surface provided with the micro lenses (the back surface) travels via the aluminum wiring and the photodiode, thus changing an optical standard of black reference, that is OB (optical black), provided in the semiconductor imaging device 4, so that the image quality deteriorates or the image does not show up in some cases. Although the OB will not be detailed here, the variation in OB generally is prevented by providing the structure in which the pixels are shielded against light around an effective pixel area of a solid-state imaging device. However, when the wafer is made thinner, various problems caused by the variation in OB due to the incident light from the back surface as described above become tangible. Accordingly, it becomes necessary to take some measures, which will be described below.

FIG. 4 shows the relationship between the wavelength of light thrown to the back surface of the semiconductor imaging device 4 and the transmitted depth of this light in the example of the present invention. More specifically, light was thrown from the light source with a constant intensity toward the back surface of the semiconductor imaging device 4. If the image quality deteriorated, then the light was judged to be transmitted. This was measured using samples with various thicknesses, each prepared by grinding the semiconductor imaging device 4 from its back surface and at various wavelengths of light. The results show that the infrared rays with a longer wavelength are transmitted more deeply, causing a deterioration of the image quality. This is considered to reflect a band gap of the semiconductor imaging device 4 and characteristics of undulations.

Although the thickness reduction of the semiconductor imaging device 4 is effective for achieving a thinner imaging apparatus, it is necessary to give due consideration to the shielding of the back surface. In the present invention, the thickness reduction was made possible by providing this shielding function actively in the FPC 8 for connection with external components.

Now, FIG. 5 will be described. FIG. 5 is a graph showing the relationship between the wavelength of light entering the FPC 8 and the shielding characteristics. The measuring method is as follows. Light was thrown to an outside surface of the aluminum metal foil 10 provided on the back surface of the FPC 8 of the imaging apparatus according to the example of the present invention illustrated in FIGS. 1 to 3 on which a 0.3 mm thick semiconductor imaging device 4 was mounted. The light intensity was varied while keeping the wavelength constant. Based on the intensity at the time when the image quality started deteriorating, the shielding characteristics at this wavelength were evaluated. The light intensity at the time when the image quality started deteriorating in the imaging apparatus having an opening in a central portion of the FPC 8 (a comparative sample) and that in the imaging apparatus of the present invention (a product of the present invention) were measured, and then the ratio of the light intensity of the product of the present invention with respect to the light intensity of the comparative sample, which was expressed by 1, was taken as the shielding characteristics. This was measured at various wavelengths. Thus, the value 1 of the shielding characteristics means a level equivalent to the case of providing no FPC 8, that is, no shielding effect. The value 10 of the shielding characteristics means that the FPC 8 prevents the deterioration of image quality with respect to light 10 times as intense as the case where no FPC is provided. FIG. 5 indicates that the present invention achieves a remarkable shielding effect especially in infrared region. This is considered to be attributable to the fact that metal has shielding characteristics and a low heat resistance.

Now, FIG. 6 will be described. FIG. 6 is a graph showing the relationship between ambient illumination and image deterioration. These values show the characteristics measured under sunlight, namely, outdoors except for the values at the illumination of 500 lx of the horizontal axis, which was measured indoors. The measuring method is as follows. Using a 0.9 mm thick semiconductor imaging device 4 as a comparative example, an imaging apparatus similar to that in the above-described example of the present invention except that an opening was provided in the central portion of the FPC 8 was examined, and ○ indicates that the image quality did not deteriorate, while × indicates that the image quality deteriorated. Further, the imaging apparatus of the above-described example of the present invention was examined, and ● indicates that the image quality did not deteriorate. As becomes clear from this figure, the image quality starts deteriorating at several thousand luces, namely, in an environment with an illumination corresponding to the outdoors when it is cloudy for the imaging apparatus of the comparative example, while the image quality does not deteriorate even at about $1 \times 10^5$ lx, namely, in an environment under cloudless skies for the example according to the present invention. Thus, it would be understood that the present invention can achieve a sufficiently thinner imaging apparatus even in view of a 0.6 mm thickness reduction from 0.9 mm to 0.3 mm in the semiconductor imaging device 4 and an increase in thickness for the metal foil 10 and the adhesive that need to be newly added in the FPC 8. Although the above description was directed to the example of using the aluminum foil for shielding the back surface, the metal foil 10 of the present invention is not limited to this. The thickness of the metal foil 10 can be selected suitably considering the thickness and costs of the entire apparatus. There also are strong demands for reducing the weight of the imaging apparatus in addition to the thickness and size thereof. Using the metal foil 10 containing aluminum as a main component is effective because an increase in mass can be suppressed sufficiently. In the above-described example, the increase in mass was 6 mm×10 mm×0.01 mm×2.7 mg/mm$^3$≈1.6 mg for the aluminum foil portion and about 0.10 mg for the adhesive portion, which only add an amount as small as about 1.7 mg.

Further, the metal foil 10 is arranged in the FPC 8 in the region including at least the region facing the semiconductor imaging device 4, thus providing sufficient shielding characteristics. This makes it possible to prevent the influence of light entering the back surface of the semiconductor imaging device 4 owing to the mounting displacement of the FPC 8 with respect to the three-dimensional circuit board 1 or the mounting displacement between the optical system assembled at the optical center of the three-dimensional circuit board 1 and the semiconductor imaging device 4 or diffraction light from around the FPC 8. The specific dimension of the region of the FPC 8 for improving the shielding characteristics (the region in which the metal foil 10 is laminated) can be determined suitably considering the accuracy of a mounting installation, the accuracy of individual component dimension and the costs. However, it would be readily understood that such a region has to be equal to or larger than the region facing the semiconductor imaging device 4.

The material for the metal foil 10 also can be silver or nickel.

The following is a description of the case of using silver. The imaging apparatus of the present invention commonly is used for portable equipment such as cellular phones and portable terminals. In such small-size portable equipment, the imaging apparatus often is mounted in the vicinity of other circuits. Thus, it is necessary to give consideration to prevent noises induced by other circuits from being superimposed on the imaging signal or a clock of the imaging apparatus from becoming a source of noises in the small-size portable equipment. To this end, the use of silver having excellent ductility and malleability and a small specific resistance improves EMI characteristics and immunity characteristics. Furthermore, since silver is a precious metal, it need not be subjected to an anti-oxidation treatment and the like and, therefore, can be used without considering any special antirust treatment or any influence on the FPC. Conversely, consideration in various aspects becomes unnecessary, so that the degree of freedom in designing increases.

Now, the case of using nickel will be discussed. Since nickel has a small specific resistance, though not as small as silver, and is a ferromagnet, it can serve as an electromagnetic shield in high-frequency equipment such as cellular phones. Because of its high magnetic permeability, nickel can enhance a shielding effect especially at high frequencies. An imaging apparatus according to the present invention using a nickel foil as the metal foil 10 was mounted in a cellular phone, and the unwanted emission was evaluated. As a result, it was found that the unwanted emission decreased in a several GHz band. With an increase in the number of channels, cellular phones in the future are expected to use a still higher frequency range. Accordingly, mounting the imaging apparatus using the nickel foil as the metal foil 10 is expected to achieve a new effect of reducing the unwanted emission.

Although the above-described example has been directed to an example of using the VGA CCD as the semiconductor imaging device 4, the present invention is not limited to this. Semiconductor imaging devices of other forms such as CIF (common intermediate format) and Q-CIF and C-MOS semiconductor imaging devices also can be used. Moreover, the present invention also can be modified suitably into still other types based on the concept of the present invention.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An imaging apparatus comprising:
    a three-dimensional circuit board transmitting virtually no visible light, the three-dimensional circuit board comprising
        a cylindrical barrel portion, and
        a bottom portion;
    a wiring pattern formed on a surface of the bottom portion of the three-dimensional circuit board opposite to the barrel portion;
    a semiconductor imaging device that is bare-mounted on the wiring pattern and held by the three-dimensional circuit board;
    an optical system that is held by the barrel portion and directs light to the semiconductor imaging device; and
    a flexible printed circuit, disposed on the three-dimensional circuit board on a side opposite to the barrel portion, for sending a signal to and receiving a signal from the semiconductor imaging device;
    wherein the flexible printed circuit entirely covers a surface of the semiconductor imaging device opposite to a surface thereof facing the optical system and a region of the flexible printed circuit facing the semiconductor imaging device has sufficient shielding characteristics in a range sensitive to light reception by the semiconductor imaging device.

2. The imaging apparatus according to claim 1, wherein the semiconductor imaging device has a thickness of 0.3 mm or smaller obtained by grinding its back surface.

3. The imaging apparatus according to claim 1, wherein in the region of the flexible printed circuit facing the semiconductor imaging device, the shielding characteristics against light with a wavelength longer than a visible range is higher than that against light in the visible range.

4. The imaging apparatus according to claim 1, wherein a metal foil is laminated entirely on the region of the flexible printed circuit facing the semiconductor imaging device on a surface opposite to a surface facing the semiconductor imaging device.

5. The imaging apparatus according to claim 4, wherein the metal foil contains aluminum as a main component.

6. The imaging apparatus according to claim 4, wherein the metal foil contains silver or nickel as a main component.

* * * * *